United States Patent
Sheraw et al.

(10) Patent No.: US 9,634,084 B1
(45) Date of Patent: Apr. 25, 2017

(54) CONFORMAL BUFFER LAYER IN SOURCE AND DRAIN REGIONS OF FIN-TYPE TRANSISTORS

(71) Applicant: GLOBALFOUNDRIES INC., GRAND CAYMAN (KY)

(72) Inventors: Christopher D. Sheraw, Wappingers Falls, NY (US); Chengwen Pei, Danbury, CT (US); Eric T. Harley, Bel Air, MD (US); Yue Ke, Fishkill, NY (US); Henry K. Utomo, Newburgh, NY (US); Yinxiao Yang, Saratoga Springs, NY (US); Zhibin Ren, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/040,477

(22) Filed: Feb. 10, 2016

(51) Int. Cl.
*H01L 29/78* (2006.01)
*H01L 29/06* (2006.01)
(Continued)

(52) U.S. Cl.
CPC ........ *H01L 29/0615* (2013.01); *H01L 21/324* (2013.01); *H01L 29/41791* (2013.01); *H01L 29/66795* (2013.01); *H01L 29/785* (2013.01)

(58) Field of Classification Search
CPC . H01L 29/0615; H01L 29/785; H01L 21/324; H01L 29/41791; H01L 29/66795
See application file for complete search history.

(56) References Cited

U.S. PATENT DOCUMENTS

| 8,278,179 B2 | 10/2012 | Lin et al. |
| 2008/0265321 A1 | 10/2008 | Yu et al. |
| (Continued) | | |

FOREIGN PATENT DOCUMENTS

| EP | 2002468 B1 | 7/2013 |
| JP | 2009532907 T2 | 9/2009 |
| (Continued) | | |

OTHER PUBLICATIONS

Sun, B., et al., High Quality Single Crystalline Ge(111) Growth on Si(111) Substrates by Solid Phase Epitaxy; Chin. Phys. Lett., 2012, vol. 29, No. 3, pp. 036102-1 to 031102-3.
(Continued)

*Primary Examiner* — Roy Potter
*Assistant Examiner* — Paul Patton
(74) *Attorney, Agent, or Firm* — Scully Scott Murphy and Presser; Frank Digiglio

(57) ABSTRACT

Fin-type transistor fabrication methods and structures are provided which include, for example, providing a gate structure extending at least partially over a fin extended above a substrate structure, the gate structure being disposed adjacent to at least one region of the fin; disposing a protective film conformally over the gate structure and over the at least one region; modifying the protective film over the at least one region of the fin to form a conformal buffer layer, wherein the modifying selectively alters a crystalline structure of the protective film over the at least one region which thereby becomes the conformal buffer layer, without altering the crystalline structure of the protective film disposed over the gate structure; and removing the un-altered protective film over the gate structure, leaving the conformal buffer layer over the at least one region to form a source region and a drain region of the fin-type transistor.

19 Claims, 4 Drawing Sheets

(51) Int. Cl.
*H01L 21/324* (2006.01)
*H01L 29/66* (2006.01)
*H01L 29/417* (2006.01)

(56) References Cited

U.S. PATENT DOCUMENTS

| | | |
|---|---|---|
| 2010/0065917 A1 | 3/2010 | Ohta et al. |
| 2011/0223736 A1 | 9/2011 | Lin et al. |
| 2013/0175638 A1 | 7/2013 | Ho et al. |
| 2013/0334615 A1 | 12/2013 | Ho et al. |
| 2015/0380558 A1* | 12/2015 | Huang ............... H01L 29/66795 257/288 |

FOREIGN PATENT DOCUMENTS

| | | |
|---|---|---|
| JP | 2010073869 A2 | 4/2010 |
| JP | 2013030776 A2 | 2/2013 |

OTHER PUBLICATIONS

Sato, F., et al., "Solid-Phase Epitaxy with X-Ray Irradiation to Grow Dislocation-Free Silicon Films at Low Temperatures"; Japanese Journal of Applied Physics, vol. 30, No. 2A, Feb. 1991, pp. 205-208.

* cited by examiner

CONFORMAL BUFFER LAYER IN SOURCE AND DRAIN REGIONS OF FIN-TYPE TRANSISTORS

FIELD OF THE INVENTION

The present invention relates to fin-type transistor structures and to methods for fabricating fin-type transistors, and more particularly to fin-type transistors with conformal buffer layers for use in fabricating improved epitaxial source and drain regions of fin-type transistors.

BACKGROUND

Fin-type field-effect transistor (FinFET) devices continue to be developed to replace traditional planar metal-oxide-semiconductors, field-effect transistors (MOSFETs) in advanced complementary metal oxide semiconductor (CMOS) technology, due to their improved short-channel effect immunity and higher on-current to off-current ratio ($I_{on}/I_{off}$). As is known, the term "fin" refers to a vertical structure within or upon which are formed, for example, one or more FinFETs or other fin devices, including capacitors, diodes, etc. Advantageously, the fin structure having one or more gate structures, for example, a double gate or tri-gate structure, wrapped around the one or more fin structures (referred to herein as fins) may be employed to help control current leakage through the transistor in the off-stage as well as other short-channel effects.

BRIEF SUMMARY

Enhancements in fin device structures and fabrication methods continue to be desired for enhanced performance and commercial advantage.

Certain shortcomings of the prior art are overcome and additional advantages are provided through the provision, in one aspect, of a method for fabricating a fin-type transistor which includes: providing a gate structure extending at least partially over a fin extended above a substrate structure, the gate structure being disposed adjacent to at least one region of the fin; disposing a protective film conformally over the gate structure and over the at least one region of the fin; modifying the protective film over the at least one region of the fin to form a conformal buffer layer, wherein the modifying selectively alters a crystalline structure of the protective film over the at least one region which thereby becomes the conformal buffer layer, without altering the crystalline structure of the protective film disposed over the gate structure; and removing the un-altered protective film over the gate structure, leaving the conformal buffer layer over the at least one region to form a source region and a drain region of the fin-type transistor.

In a further aspect, a fin-type transistor is provided which includes: a gate structure extending at least partially over a fin extended above a substrate structure, the gate structure being disposed adjacent to at least one region of the fin; a conformal buffer layer having a uniform thickness being disposed over the at least one region of the fin; and a semiconductor material disposed directly in contact with the conformal buffer layer, where the semiconductor material forms a source region and a drain region of the fin-type transistor.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
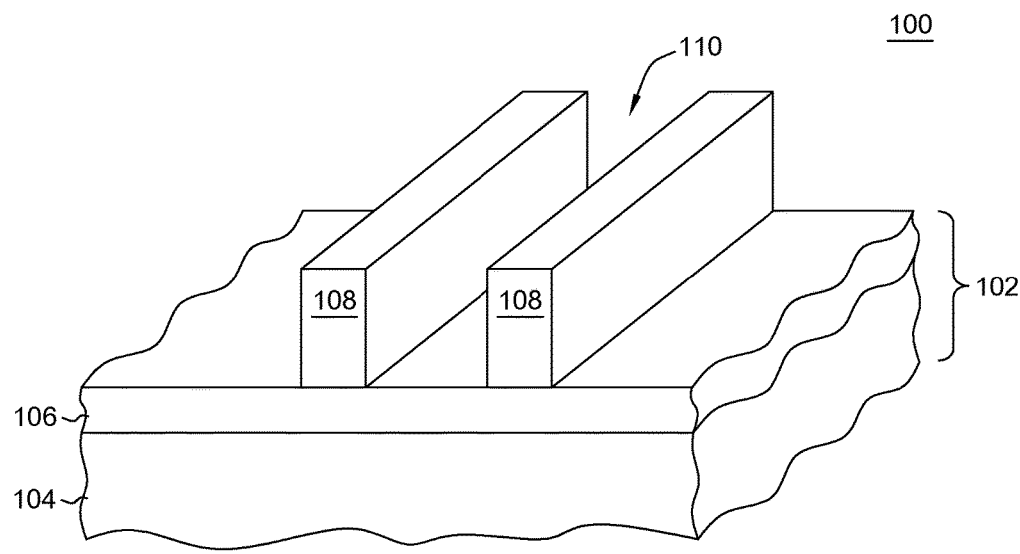
FIG. 1A depicts a cross-sectional elevational view of a structure obtained during a fin-type transistor fabrication process, and illustrating one or more fins extended above a substrate structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in details. It should be understood, however, that the detailed description and the specific examples, while indicating embodiments of the invention, are given by way of illustration only, and not by way of limitation. Various substitutions, modifications, additions and/or arrangements within the spirit and/or scope of the underlying inventive concepts will be apparent to those skilled in the art from this disclosure.

The present disclosure provides, in part, fin-type transistor structures with improved epitaxially grown source and drain regions fabricated, for instance, over a conformal buffer layer, and methods for fabrication thereof. In one aspect, in operation of a fin-type transistor, when an appropriate voltage is applied on a gate structure, charge carriers (for instance, electrons or holes generated by the heavily-doped semiconductor material) flow from a source region to a drain region of the transistor through a channel region disposed within the fin(s). For example, during fin-type field-effect transistor (FinFET) device fabrication, heavily-doped semiconductor material, for instance, silicon or silicon germanium material, may be epitaxially grown over a portion of the fin not covered by the gate to form source and drain region(s) of the fin-type transistor, with the source and drain regions being formed as shaped-structures, for example, as diamond-shaped structures. As is known, the fin(s) may include or be fabricated of an undoped semiconductor material, for instance, silicon or silicon germanium material. Disadvantageously, the dopants from the heavily-doped, diamond-shaped semiconductor material of source and drain region(s) may be at least partially diffused into the undoped fin semiconductor material resulting in non-uniform doping profile which, for instance, causes degradation of the structural integrity of the fin(s); thereby resulting in degraded transistor characteristics.

In order to inhibit this diffusion of dopants into the fin(s), a buffer layer is epitaxially grown over the fin(s), prior to forming the source and drain regions thereof. In one example, the buffer layer may include or be fabricated of an undoped semiconductor material, such as, undoped silicon or undoped silicon germanium material. In another example, the buffer layer may also include or be fabricated of a semiconductor material having a dopant concentration lower than the dopant concentration of heavily-doped, diamond-shaped semiconductor material used for establishing the source and drain region(s). Disadvantageously, owing to differences in the crystal orientations between the fin semiconductor material and the undoped semiconductor material of the buffer layer, the buffer layer may be epitaxially grown to form a shaped-structure, for instance, a diamond-shaped structure over the fin(s). This, in turn, could cause non-uniform doping and/or junction profile of the fin(s) which, for instance, could result in issues such as, gate-induced drain-leakage (GIDL), short channel effect, punch-through leakage current, and therefore performance degradation of the resultant fin-type field-effect transistor device(s).

To address these issues, disclosed herein, in one aspect is a method for fabricating a fin-type transistor. The fabrication includes: providing a gate structure extending at least partially over a fin extended above a substrate structure, the gate structure being disposed adjacent to at least one region of the fin; disposing a protective film conformally over the gate structure and over the at least one region of the fin; modifying the protective film over the at least one region of the fin to form a conformal buffer layer, where such modifying selectively alters a crystalline structure of the protective film over the at least one region of the fin, without altering the crystalline structure of the protective film disposed over the gate structure; and removing the un-altered protective film over the gate structure, leaving the conformal buffer layer over the at least one region to form at least one of a source region and a drain region of the fin-type transistor.

In one embodiment, the protective film may be disposed continuously and conformal with the gate structure, with the at least one region of the fin (for instance, upon which the source and drain regions of the fin are to be formed), and with the substrate structure. Further, the modification of the protective film does not alter the crystalline structure of the protective film disposed over the substrate structure (for instance, including an oxide material). In one example, the protective film may include or be fabricated of a silicon material, and the modification may include performing a solid phase epitaxial (SPE) process to facilitate altering the crystalline structure of the protective film over the at least one region of the fin, without altering the crystalline structure of the protective film disposed over the gate structure and the substrate structure. In this example, the solid phase epitaxial (SPE) process may be performed at a temperature within a range of about 600° C. to about 700° C.

In another example, the protective film may include or be fabricated of a silicon germanium material, and the modification may include performing a crystallization annealing process to facilitate altering the crystalline structure of the protective film selectively over the at least one region of the fin, without altering the crystalline structure of the protective film disposed over the gate structure and the substrate structure. In a specific example, the crystallization annealing process may be performed at a temperature within a range from about 450° C. to about 600° C. Further, the removal of the protective film may include removing the protective film disposed over the gate structure (for instance, including a nitride material) and the substrate structure (for instance, including an oxide material), while maintaining the conformal buffer layer disposed over the at least one region of the fin.

In another aspect, the at least one region of the fin may include a first semiconductor material, and the protective film may include a second semiconductor material, with the first semiconductor material helping to cause the altering of the crystalline structure of the protective film disposed at an upper surface thereof, relative to the protective film disposed over the gate structure. Further, the protective film disposed over the gate structure, the at least one region of the fin, and the substrate structure may be non etch-selective to at least one of an oxide materials, such as, for instance, a buried oxide material of the substrate structure, or a nitride materials, such as, for instance, a silicon nitride (SiN or $Si_3N_4$) spacer material which has been disposed over the gate structure. Furthermore, the conformal buffer layer may be etch-resistant to halogen-containing gases, such as, for instance, gas-phase hydrochloric acid (HCl) employed during the removal of the protective film disposed over the gate structure. The conformal buffer layer may have a (100) crystalline surface extending along at least one sidewall of the fin and an upper surface of the fin. In an enhanced embodiment, the conformal buffer layer provides a conformal doping profile and a conformal junction profile of the fin.

In a further aspect, the fabrication method may further include epitaxially growing a semiconductor material over the conformal buffer layer to form at least one of a source region or a drain region of the fin-type transistor. The conformal buffer layer, for example, may include or be fabricated of an in-situ doped semiconductor material having a first dopant concentration, and the semiconductor material over the conformal buffer layer may have a second dopant concentration, with the first dopant concentration being lower than the second dopant concentration.

In yet another aspect, a structure is provided which includes a fin-type transistor. The fin-type transistor includes: a gate structure extending at least partially over a fin extended above a substrate structure, with the gate structure being disposed adjacent to at least one region of the fin. Further, a conformal buffer layer having a uniform thickness may be disposed over the at least one region of the fin, and a semiconductor material may be disposed directly in contact with the conformal buffer layer, with the semiconductor material forming at least one of a source region or a drain region of the fin-type transistor. In such a case, the conformal buffer layer may have a (100) crystalline surface extending along at least one sidewall of the fin and an upper surface of the fin. In one aspect, the conformal buffer layer may have a thickness within a range of about 1 nm to about 50 nm. In a specific example, the conformal buffer layer may have a thickness within a range of about 5 nm to about 20 nm.

In one embodiment, the conformal buffer layer may include an in-situ doped semiconductor material having a first dopant concentration, and the semiconductor material disposed over the conformal buffer layer may have a second dopant concentration, with the second dopant concentration being greater than the first dopant concentration. Further, the conformal buffer layer may provide a uniform doping profile and a conformal junction profile of the fin.

Reference is made below to the drawings, which are not drawn to scale for ease of understanding, wherein the same reference numbers used throughout different figures designate the same or similar components.

By way of example, FIGS. 1A-1G depict one detailed embodiment of a method and the structure for fabricating a conformal buffer layer over one or more region(s) of fin(s). Advantageously, as described below, the conformal buffer layer provided over the region(s) of fin(s) facilitates enhancing a conformal doping profile and a conformal junction profile of the fin, in accordance with one or more aspects of the present invention.

FIG. 1A depicts a cross-sectional elevational view of a structure obtained during a fin-type transistor fabrication process, which includes, in one example, a substrate structure 102. Substrate structure 102 includes, for instance, a semiconductor substrate 104 and one or more insulating substrate layers 106 disposed above semiconductor substrate 104. In one embodiment, semiconductor substrate 104 may be a bulk semiconductor material such as, for example, a bulk silicon wafer. In another embodiment, semiconductor substrate 104 may be any silicon-containing substrate including, but not limited to, silicon (Si), single crystal silicon (Si), polycrystalline Si, amorphous Si or the like. Semiconductor substrate 104 may in addition, or instead, include various isolations, dopings and/or device features. Insulating substrate layer(s) 106 may be or include a buried dielectric layer such as, for instance, a buried oxide (BOX) layer, silicon-on-nothing (SON), silicon-on-insulator or the like. For instance, buried oxide layer 106 may be fabricated by employing SIMOX (Separation by Implanted Oxygen) technique which, for instance, may include implanting high doses of oxygen ($O^+$) ions into silicon substrate 104, and annealing at a high temperature to form a layer of buried oxide 106 over the silicon substrate 104. As one skilled in the art will understand, the fabrication of buried oxide layer 106 could result in a residual layer of semiconductor material (not shown) from the semiconductor substrate to be disposed over the insulating substrate layer. This residual layer of semiconductor material may be patterned to form one or more fin structures or fin(s).

Continuing with FIG. 1A, one or more fins 108 may be patterned to extend above substrate structure 102. Fin(s) 108, which may include a semiconductor material, such as, for instance, silicon or silicon germanium material, may be formed by patterning substrate structure 102 using any of various approaches including: direct lithography; sidewall image transfer technique; extreme ultraviolet technique (EUV); e-beam technique; litho-etch litho-etch or litho-etch litho-freeze. Following patterning, additional etching processes, such as anisotropic dry etching processes, may be performed to remove one or more portions of substrate structure 102. In one example, adjacent fins 108 may be separated by a respective opening 110.

Figure 1B:
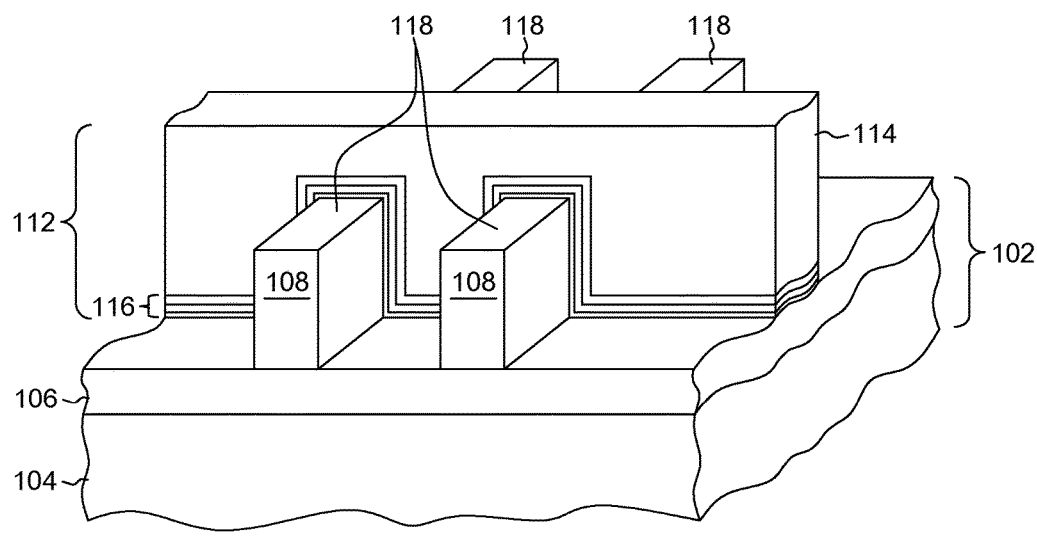
FIG. 1B depicts the structure of FIG. 1A, after providing a gate structure extending at least partially over the fin(s), in accordance with one or more aspects of the present invention.

FIG. 1B depicts the structure of FIG. 1A, after providing gate structure 112 extending at least partially over fin(s) 108. Gate material 114 may be provided over one or more layers 116, such as, for instance, a gate dielectric layer and/or work function layer to form gate structure 112. This gate structure 112 may extend over fin(s) 108, and may overlap fin(s) 108 in selected areas to operate as, for instance, the gate of a fin-type transistor. In one example, gate material 114 may include or be fabricated of a metal, and be formed as a part of a gate-first fabrication process. Alternatively, in another example, gate material 114 may include or be fabricated of a sacrificial gate material, such as an amorphous silicon (a-Si) or polycrystalline silicon (polysilicon), which may subsequently be replaced with a replacement gate material, as part of a gate-last fabrication process.

Continuing with FIG. 1B, gate structure 112 may be disposed adjacent to one or more regions 108 of fin(s) 108. In one example, region(s) 118 of fin(s) 108 may be or include a semiconductor material, upon which the respective source and drain regions of fin-type transistors can be formed and gated by the gate structure, in accordance with the processing described herein with reference to FIGS. 1A-1G.

Figure 1C:
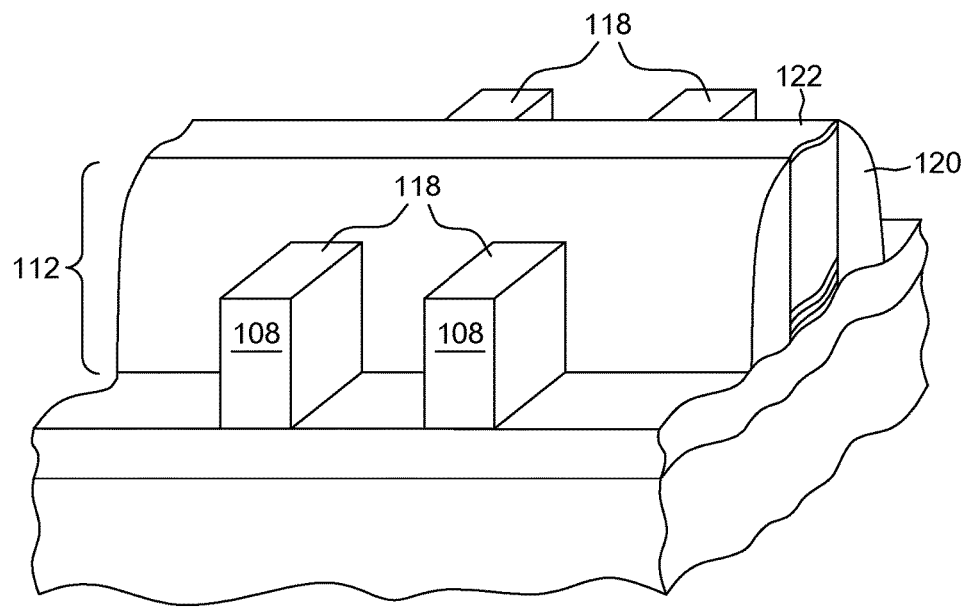
FIG. 1C depicts the structure of FIG. 1B, with sidewall spacers having been provided along the sidewalls of the gate structure, and a protective hard-mask disposed thereover, in accordance with one or more aspects of the present invention.

FIG. 1C depicts the structure of FIG. 1B, with sidewall spacers 120 having been provided along the sidewalls of gate structure 112, and a protective hard-mask 122 disposed over an upper surface of gate structure 112. Sidewall spacers 120 and protective hard mask 122, for example, may be fabricated by providing a sidewall spacer layer (not shown) conformally over gate structure 112. In one example, the sidewall spacer layer may include or be fabricated of a nitride material, such as, for instance, silicon nitride ($Si_3N_4$ or SiN), which may be conformally deposited using a variety of techniques, for example, chemical vapor deposition (CVD) or atomic layer deposition (ALD).

The sidewall spacer layer may be etched, for instance, using any appropriate selective etching process(es) to form sidewall spacers 120 along the sidewalls of gate structure 112 and protective hard-mask 122 disposed over an upper surface of gate structure 112, as shown in FIG. 1C. The sidewall spacer layer may be selectively etched using conventional isotropic or anisotropic dry etching processes, such as, reactive ion etching or plasma etching. In one example, the thickness of sidewall spacers 120 and protective hard-mask 122 may be about 3 nm to about 30 nm, depending upon the processing node in which the semiconductor device is being fabricated. In a specific example, the thickness of sidewall spacers 120 and protective hard-mask 122 may be about 5 nm to about 20 nm.

Figure 1D:
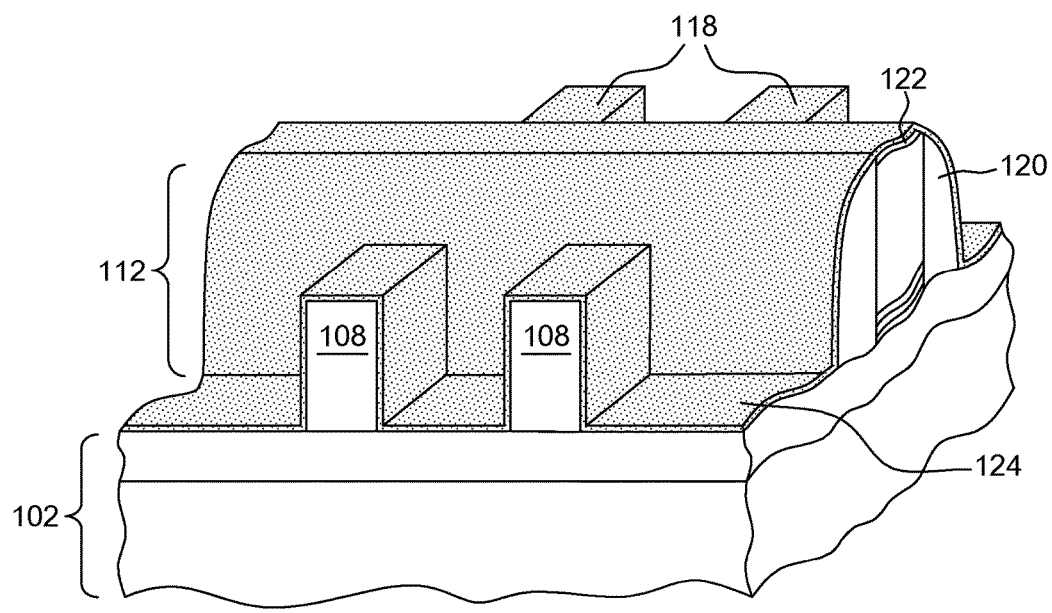
FIG. 1D depicts the structure of FIG. 1C, with a continuous protective film having been disposed conformally over the gate structure and one or more region(s) of the fin(s), in accordance with one or more aspects of the present invention.

FIG. 1D depicts the structure of FIG. 1C, with protective film 124 having been disposed conformally over gate structure 112 and region(s) 118 of fin(s) 108, in accordance with one or more aspects of the present invention. Protective film 124, in one embodiment, may be disposed conformally over the entirety of the semiconductor wafer which, in one example, includes gate structure 112, region(s) 118 of the fin(s) and substrate structure 102, using one or more conventional deposition processes. As used herein, the term "conformally" refers to the protective film being disposed along and over the contours of the gate structure, region(s) of the fin(s) and the substrate structure. Protective film 124 may have a thickness of about 1 nm to about 50 nm. Protective film 124 which, in a specific example, may have a thickness of about 5 nm to about 20 nm, may be deposited conformally over the entirety of semiconductor wafer using any conventional deposition process, such as chemical vapor deposition (CVD), physical vapor deposition (PVD), atomic layer deposition (ALD) or plasma-enhanced versions thereof. In one example, protective film 124 may include or be fabricated of a semiconductor material having a crystal lattice constant that is substantially similar to the crystal lattice constant of the semiconductor material of region(s) 118 of the fin(s).

Further, protective film 124 may include or be fabricated of an undoped amorphous silicon material or undoped polycrystalline silicon material. In another example, protective film 124 may also include or be an in-situ doped amorphous silicon or polycrystalline silicon having a dopant concentration of about 1E16 atom/cm$^3$ to about 1E20 atom/cm$^3$. Alternatively, the protective film may include or be fabricated of an undoped amorphous silicon germanium material or undoped polycrystalline silicon germanium material. In yet another example, protective film 124 may also be or include an in-situ doped amorphous silicon germanium or polycrystalline silicon germanium material having a dopant concentration of about 1E16 atom/cm$^3$ to about 1E20 atom/cm$^3$.

Figure 1E:
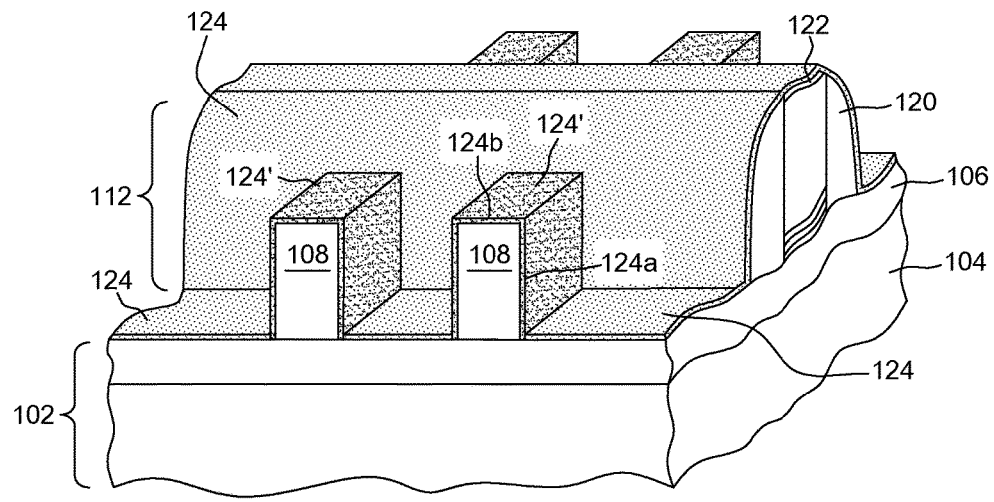
FIG. 1E depicts the structure of FIG. 1D, after modifying the protective film over the region(s) of the fin to form the conformal buffer layer, in accordance with one or more aspects of the present invention.

FIG. 1E depicts the structure of FIG. 1D, after modifying the protective film 124 disposed over region(s) 118 (FIG. 1D) of fin(s) 108 to form conformal buffer layer 124'. The modification of protective film 124 may be accomplished by, for example, altering the crystalline structure of the protective film selectively over region(s) 118 (FIG. 1D) of the fin(s) 108, without altering the crystalline structure of protective film 124 disposed over gate structure 112, and substrate structure 102. For instance, assuming that the fin(s) 108 include a semiconductor material, (for example, silicon or silicon germanium material), during the modification of the protective film, the crystalline orientations of the semiconductor fin material may be utilized as a template to enable crystal growth within the overlying protective film. This, in turn, alters the crystalline structure of protective film 124 selectively over the region(s) 108 of the fin(s) 108, relative to the crystalline structure of protective film 124 disposed over gate structure 112 and substrate structure 102. By contrast, protective film 124 may be non-selective to the oxide material (e.g., buried oxide material of the substrate structure 102), or a nitride material (e.g., silicon nitride ($Si_3N_4$ or SiN)) of sidewall spacers 120 and protective hard-mask 122 encapsulating gate structure 112, thus remaining unaffected during the modification of the protective film disposed over region(s) 118 (FIG. 1D) of fin(s) 108. Conformal buffer layer 124' may have uniform thickness which, for example, may be within a range of about 1 nm to about 50 nm. In a specific example, conformal buffer layer 124' may have uniform thickness of about 5 nm to about 20 nm.

In one embodiment of the present invention, and in particular, when the protective material may be or include a silicon material (for example, an undoped silicon, in-situ doped amorphous silicon, undoped polycrystalline silicon or in-situ doped polycrystalline silicon), the modification of the protective film may be performed by employing a solid phase epitaxial (SPE) process. As understood, solid phase epitaxial process refers to a crystallization process in which, for instance, amorphous silicon protective film 124 is changed to crystalline silicon buffer layer 124' utilizing the crystalline orientations of the underlying semiconductor fin(s) material as a template. This process, for instance, may be initiated by nucleating crystalline particles of protective film 124 at an interface of a layer of protective film 124 and the crystalline silicon material of fin(s) 108, and laterally growing outward into the silicon protective film resulting in crystalline silicon buffer layer 124' over region(s) 118 (FIG. 1D) of fin(s) 108. In a specific example, the solid phase epitaxial process may be performed by annealing at a temperature of about 600 to about 700° C. for about 30 mins in vacuum.

In an alternate embodiment, and more particularly, when the protective material may be or include a silicon germanium material (for example, undoped or in-situ doped amorphous silicon germanium material, undoped or in-situ doped polycrystalline silicon germanium material or the like), the modification of the protective film may be accomplished utilizing a crystallization or annealing process, such as, for instance, rapid thermal anneal crystallization process. In one example, the crystallization annealing process may be performed at a temperature of about 450° C. to about 600° C. for about 30 mins in vacuum. As discussed above, the crystallization process may facilitate altering the crystalline structure of protective film 124 selectively over region(s) 118 (FIG. 1D) of the fin(s) to form a conformal buffer layer 124' (FIG. 1F) thereover. As illustrated, protective film 124 may be non-selective to the oxide material, such as, buried oxide material of insulating substrate layer(s) 104, or a nitride material, such as, silicon nitride ($Si_3N_4$ or SiN) of sidewall spacers 120 and protective hard-mask 122, thus remaining unaffected during the modification of the protective film disposed over region(s) 118 (FIG. 1D) of fin(s) 108. Further, the modification of the protective film either by solid phase epitaxial growth or by crystallization annealing processes results in conformal buffer layer 124' having a (100) crystalline surface extending along sidewall(s) 124a and at an upper surface 124b of fin(s) 108. This uniform (100) crystalline surface of the conformal buffer layer 124' facilitates enhancing a conformal doping profile and conformal junction profile of the fin(s).

Figure 1F:
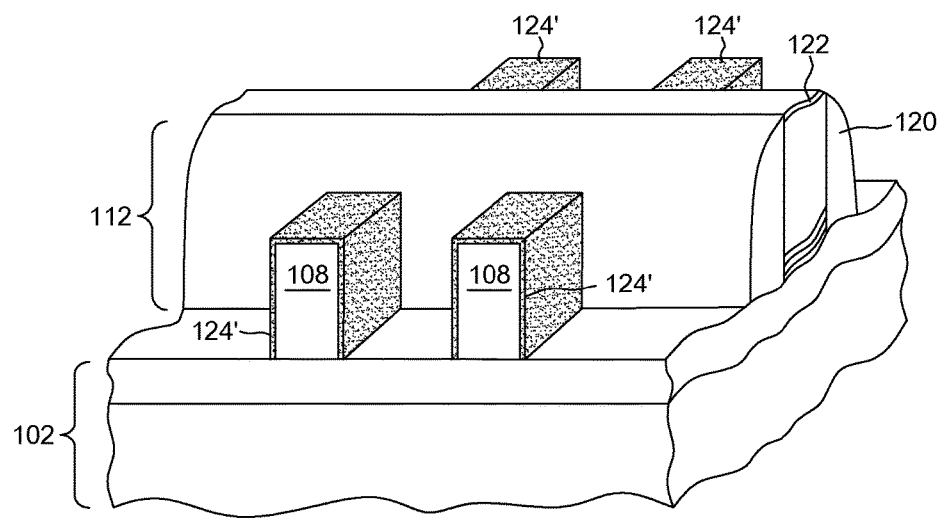
FIG. 1F depicts the structure of FIG. 1E, after removing the protective film, leaving the conformal buffer layer over the region(s) of the fin, in accordance with one or more aspects of the present invention.

As illustrated in FIG. 1F, one or more etch processes may be performed to selectively remove protective film 124 from gate structure 112 and substrate structure 102, leaving conformal buffer layer 124' disposed over fin(s) 108. The selective etch processes may be one or more isotropic, wet-etch process(es) performed utilizing gas-phase halogen-containing gases, such as, for instance, hydrochloric acid (HCl), leaving conformal buffer layer 124' over the fin(s).

Figure 1G:
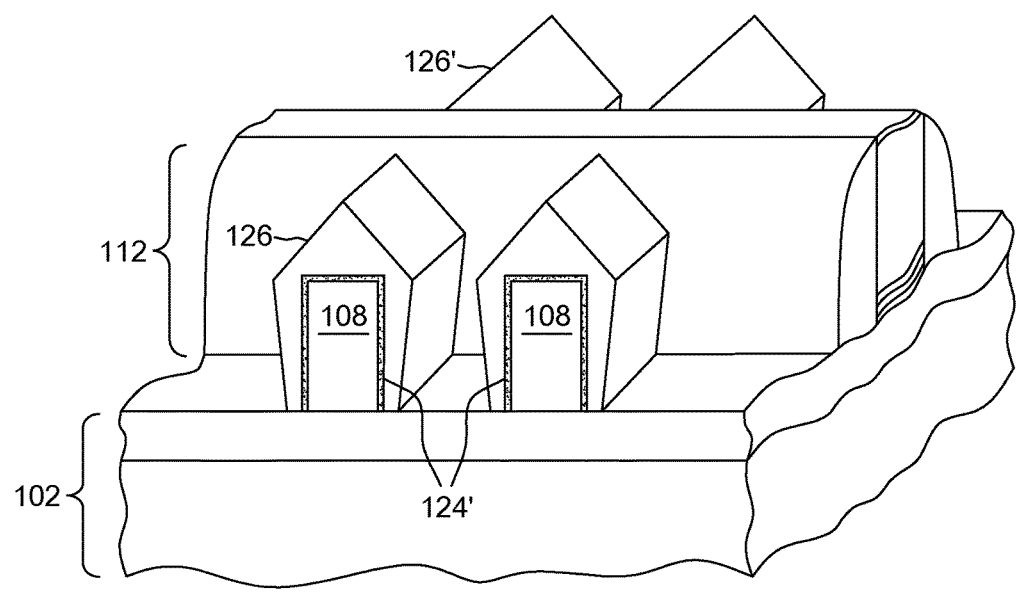
FIG. 1G depicts the resultant structure of FIG. 1F, after forming at least one of a source region or a drain region of the fin-type transistor, in accordance with one or more aspects of the present invention.

FIG. 1G depicts the resultant structure of FIG. 1F, after forming a source region 126 and a drain region 126' of the fin-type transistor. By way of example, source region 126 and drain region 126' may be formed, for instance, by epitaxially growing a semiconductor material over conformal buffer layer 124'. In one example, semiconductor material may be or include a silicon-containing material such as, for instance, silicon, silicon germanium, silicon carbide or the like. As one skilled in the art will understand that, owing to difference in growth rates of different crystallographic orientations, the epitaxial growth of the semiconductor material may define the shape of the source and drain regions of fin-type transistors resulting, for instance, in shaped-structures such as, for instance, diamond-shaped structures. For instance, the epitaxial growth rate on the silicon (Si) surface having (111) crystallographic orientation may be slower than that on other crystallographic orientations such as, (100) or (110) orientations. This, in turn, may result in a diamond-shape of source region 126 and drain region 126'.

Further, the semiconductor material, such as, for instance, silicon material, having a dopant concentration of about 1E17 atom/cm$^3$ to about 1E20 atom/cm$^3$, may be epitaxially grown over conformal buffer layer 124' to form source region 126 and drain region 126' of the fin-type transistor. In another example, the semiconductor material, such as, silicon germanium material, having a dopant concentration of about 1E17 atom/cm$^3$ to about 1E20 atom/cm$^3$, may be epitaxially grown over conformal buffer layer 124' to form source region 126 and drain region 126' of the fin-type transistor. As illustrated, conformal buffer layer 124' may facilitate enhancing a conformal doping profile and a conformal junction profile of fin(s) 108, during subsequent fabrication processing of the fin-type transistor. As used herein, "doping profile" refers to the three-dimensional distribution of p-type and n-type dopants in the channel and in the vicinity of the channel that includes at least two p-n junctions between the body of the fin-type transistor and each of the source region and the drain region of the fin-type transistor. For instance, the conformal crystalline buffer layer 124', which may be or include an undoped semiconductor material or a semiconductor material having a dopant concentration lower than the epitaxially grown semiconductor material (for instance, of the source region and drain region) may serve as a uniform buffer layer between a fin channel and heavily-doped source and drain region. This, in turn, facilitates enhancing uniform out diffusion doping, thereby resulting in a uniform doping profile and a junction profile. In another example, source and drain regions may also be formed using any suitable techniques, including, for example, ion implantation and/or epitaxial growth of embedded source/drain materials. High temperature annealing may be performed to activate the source and drain regions, with the balance of the fin-type field-effect transistor being formed, in one example, using a conventional process flow, including providing device contacts to the gate structure, the source region and the drain region of the fin-type field-effect transistor.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the present invention for various embodiments with various modifications as are suited to the particular use contemplated. Furthermore, a device or structure that is configured in a certain way is configured in at least that way, but may also be configured in ways that are not listed.

What is claimed is:

1. A method for fabricating a fin-type transistor comprising:
   providing a gate structure extending at least partially over a fin extended above a substrate structure, the gate structure being disposed adjacent to at least one region of the fin;
   disposing a protective film conformally over the gate structure and over the at least one region of the fin;
   modifying the protective film over the at least one region of the fin to form a conformal buffer layer, wherein the modifying selectively alters a crystalline structure of the protective film over the at least one region which thereby becomes the conformal buffer layer, without altering the crystalline structure of the protective film disposed over the gate structure; and
   removing the un-altered protective film over the gate structure, leaving the conformal buffer layer over the at least one region to form at least one of a source region and a drain region of the fin-type transistor.

2. The method of claim 1, wherein the protective film is disposed continuously and conformal with the gate structure, with the at least one region of the fin, and with the substrate structure.

3. The method of claim 2, wherein the modifying does not alter the crystalline structure of the protective film disposed over the substrate structure.

4. The method of claim 3, wherein the protective film comprises a silicon material, and the modifying comprises performing a solid phase epitaxial (SPE) process to facilitate altering the crystalline structure of the protective film over the at least one region of the fin.

5. The method of claim 4, wherein the solid phase epitaxial (SPE) process is performed at a temperature within a range of about 600 to about 700° C.

6. The method of claim 3, wherein the protective film comprises a silicon germanium material, and the modifying comprises performing a crystallization annealing process to facilitate altering the crystalline structure of the protective film over the at least one region of the fin.

7. The method of claim 6, wherein the crystallization annealing process is performed at a temperature within a range from about 450° C. to about 600° C.

8. The method of claim 2, wherein the protective film disposed over the gate structure and the substrate structure is removed, while maintaining the conformal buffer layer disposed over the at least one region of the fin.

9. The method of claim 1, wherein the at least one region of the fin comprises a first semiconductor material, and the protective film comprises a second semiconductor material, the first semiconductor material causing the altering of the crystalline structure of the protective film disposed at an upper surface thereof, relative to the protective film disposed over the gate structure.

10. The method of claim 1, wherein the protective film is non etch-selective to at least one of an oxide material and a nitride material.

11. The method of claim 1, wherein the conformal buffer layer is etch-resistant to halogen-containing etching gases employed during the removing of the protective film disposed over the gate structure.

12. The method of claim 1, wherein the conformal buffer layer has a (100) crystalline surface extending along at least one sidewall of the fin and an upper surface of the fin.

13. The method of claim 1, wherein the conformal buffer layer provides a conformal doping profile and a conformal junction profile of the fin.

14. The method of claim 1, further comprising epitaxially growing a semiconductor material over the conformal buffer layer to form at least one of a source region and a drain region of the fin-type transistor.

15. The method of claim 14, wherein the conformal buffer layer comprises an in-situ doped semiconductor material having a first dopant concentration, and the semiconductor material over the conformal buffer layer has a second dopant concentration, the first dopant concentration being lower than the second dopant concentration.

16. A fin-type transistor comprising:
  a gate structure extending at least partially over a fin extended above a substrate structure, the gate structure being disposed adjacent to at least one region of the fin;
  a conformal buffer layer having a uniform thickness being disposed over the at least one region of the fin; and
  a semiconductor material disposed directly in contact with the conformal buffer layer, wherein the semiconductor material forms at least one of a source region and a drain region of the fin-type transistor, wherein the conformal buffer layer has a (100) crystalline surface extending along at least one sidewall of the fin and an upper surface of the fin.

17. The fin-type transistor of claim 16, wherein the conformal buffer layer has a thickness within a range of about 2 nm to about 20 nm.

18. The fin-type transistor of claim 16, wherein the conformal buffer layer comprises an in-situ doped semiconductor material having a first dopant concentration, and the semiconductor material disposed over the conformal buffer layer has a second dopant concentration, the first dopant concentration being lower than the second dopant concentration.

19. The fin-type transistor of claim 16, wherein the conformal buffer layer provides a uniform doping profile and a conformal junction profile of the fin.

* * * * *